United States Patent
Lou et al.

(10) Patent No.: US 8,254,515 B2
(45) Date of Patent: Aug. 28, 2012

(54) METHOD FOR MEASURING PHASE LOCKED LOOP BANDWIDTH PARAMETERS FOR HIGH-SPEED SERIAL LINKS

(75) Inventors: Dongming Lou, Shanghai (CN); Pengfei Hu, Shanghai (CN); Junqiang Shang, Shanghai (CN); Xin Liu, Shanghai (CN)

(73) Assignee: Integrated Device Technology, Inc., San Jose, CA (US)

(*) Notice: Subject to any disclaimer, the term of this patent is extended or adjusted under 35 U.S.C. 154(b) by 791 days.

(21) Appl. No.: 12/410,413

(22) Filed: Mar. 24, 2009

(65) Prior Publication Data

US 2010/0246739 A1    Sep. 30, 2010

(51) Int. Cl.
H03D 3/24 (2006.01)
H04Q 1/20 (2006.01)
H04L 23/00 (2006.01)

(52) U.S. Cl. .................. 375/376; 375/226; 375/377

(58) Field of Classification Search .......... 375/224, 375/354, 371, 373, 376, 377, 226–227; 327/147, 327/156
See application file for complete search history.

(56) References Cited

U.S. PATENT DOCUMENTS

| | | | |
|---|---|---|---|
| 6,246,738 B1 | 6/2001 | Acimovic et al. | |
| 6,396,889 B1 * | 5/2002 | Sunter et al. | 375/376 |
| 7,102,401 B2 | 9/2006 | Galloway | |
| 7,260,168 B2 * | 8/2007 | Taylor et al. | 375/375 |
| 7,406,144 B2 | 7/2008 | Wang | |
| 7,480,581 B2 * | 1/2009 | Lew et al. | 702/107 |

OTHER PUBLICATIONS

Xia et al., Employing On-Chip Jitter Test Circuit for Phase Locked Loop Self-Calibration, 2006, 21st IEEE International Symposium on Defect and Fault Tolerance in VLSI Systems, pp. 12-19.*
Dosho et al., A Background Optimization Method for PLL by Measuring Phase Jitter Performance, 2005, Solid State Circuits, IEEE Journal of, vol. 40, Issue: 4, pp. 941-950.*

* cited by examiner

Primary Examiner — Lawrence B Williams
(74) Attorney, Agent, or Firm — Roeder & Broder (57) ABSTRACT

A method for measuring a phase locked loop bandwidth parameter for a high-speed serial link includes the steps of initiating a jitter frequency of a clock input of a phase locked loop equal to a reference frequency with a frequency generator; determining a reference jitter amplitude value of a clock output of the phase locked loop with a waveform analyzer at the reference frequency, the reference jitter amplitude value being a function of a time interval error jitter trend of the clock output at the reference frequency; and adjusting the jitter frequency of the clock input with the frequency generator until an adjusted jitter amplitude value of the clock output reaches a goal value as determined by the waveform analyzer, the adjusted jitter amplitude being a function of a time interval error trend of the clock output at the adjusted frequency.

31 Claims, 10 Drawing Sheets

| Parameter | Min | Max | Units |
|---|---|---|---|
| -3dB frequency bandwidth (3.2 and 4.0 Gb/s link speeds) | 11 | 33 | MHz |
| -3dB frequency bandwidth (4.8 Gb/s link speed) | 11 | 22 | MHz |
| Jitter Peaking dB frequency bandwidth | 0.5 | 3 | dB |

Fig. 6

| Test reference clock 133.33333 MHz | | |
|---|---|---|
| Jitter frequency (Hz) | rms dB | AC rms |
| 1.00E+05 | 0 | 197.19 |
| 2.00E+05 | 0.01 | 197.394 |
| 4.00E+05 | 0.08 | 198.942 |
| 6.00E+05 | 0.2 | 201.718 |
| 8.00E+05 | 0.36 | 205.504 |
| 1.00E+06 | 0.51 | 209.138 |
| 1.20E+06 | 0.65 | 212.42 |
| 1.40E+06 | 0.76 | 215.123 |
| 1.60E+06 | 0.85 | 217.494 |
| 1.80E+06 | 0.93 | 219.501 |
| 2.00E+06 | 0.99 | 220.981 |
| 2.20E+06 | 1.02 | 221.88 |
| 2.40E+06 | 1.04 | 222.372 |
| 2.60E+06 | 1.04 | 222.387 |
| 2.80E+06 | 1.03 | 221.899 |
| 3.00E+06 | 1.01 | 221.477 |
| 5.00E+06 | 0.41 | 206.702 |
| 7.00E+06 | -0.57 | 184.657 |
| 9.00E+06 | -1.65 | 163.079 |
| 1.00E+07 | -2.19 | 153.156 |
| 1.10E+07 | -2.74 | 143.78 |
| 1.12E+07 | -2.85 | 141.955 |
| 1.14E+07 | -2.96 | 140.217 |
| 1.15E+07 | -3.02 | 139.319 |

| Test reference clock 166.66666 MHz | | | |
|---|---|---|---|
| Jitter frequency (Hz) | rms dB | AC rms | Temperature |
| 1.00E+05 | 0 | 197.87 | 118 |
| 2.00E+05 | -0.02 | 197.468 | 118 |
| 4.00E+05 | 0.03 | 198.521 | 118 |
| 6.00E+05 | 0.12 | 200.67 | 118 |
| 8.00E+05 | 0.26 | 203.816 | 118 |
| 1.00E+06 | 0.38 | 206.789 | 118 |
| 1.20E+06 | 0.49 | 209.46 | 118 |
| 1.40E+06 | 0.6 | 212.008 | 118 |
| 1.60E+06 | 0.69 | 214.232 | 118.5 |
| 1.80E+06 | 0.77 | 216.132 | 118.5 |
| 2.00E+06 | 0.85 | 218.086 | 118.5 |
| 2.20E+06 | 0.91 | 219.62 | 118.5 |
| 2.40E+06 | 0.95 | 220.68 | 118.5 |
| 2.60E+06 | 0.97 | 221.195 | 118.5 |
| 2.80E+06 | 0.99 | 221.752 | 118.5 |
| 3.00E+06 | 1 | 221.935 | 118.5 |
| 3.20E+06 | 1 | 222.024 | 118.5 |
| 3.40E+06 | 1 | 222.117 | 118.5 |
| 3.60E+06 | 0.99 | 221.629 | 118.5 |
| 3.80E+06 | 0.96 | 221.112 | 118.5 |
| 5.80E+06 | 0.5 | 209.707 | 119 |
| 7.80E+06 | -0.26 | 191.962 | 119 |
| 9.80E+06 | -1.11 | 174.189 | 119 |
| 1.18E+07 | -2.01 | 156.944 | 118.5 |
| 1.28E+07 | -2.46 | 149.122 | 119 |
| 1.30E+07 | -2.54 | 147.642 | 119 |
| 1.32E+07 | -2.63 | 146.112 | 118.5 |
| 1.34E+07 | -2.72 | 144.596 | 119 |
| 1.36E+07 | -2.81 | 143.1 | 119 |
| 1.38E+07 | -2.91 | 141.509 | 119 |
| 1.39E+07 | -2.96 | 140.664 | 119 |
| 1.40E+07 | -3.01 | 139.92 | 119 |

| Test reference clock 200.0 MHz | | | |
|---|---|---|---|
| Jitter frequency (Hz) | rms dB | AC rms | Temperature |
| 1.00E+05 | 0 | 197.35 | 120 |
| 2.00E+05 | -0.01 | 197.196 | 120.5 |
| 4.00E+05 | 0.03 | 197.983 | 120.5 |
| 6.00E+05 | 0.09 | 199.514 | 120.5 |
| 8.00E+05 | 0.22 | 202.361 | 120.5 |
| 1.00E+06 | 0.32 | 204.769 | 120.5 |
| 1.20E+06 | 0.42 | 207.097 | 120.5 |
| 1.40E+06 | 0.51 | 209.35 | 120.5 |
| 1.60E+06 | 0.6 | 211.497 | 120.5 |
| 1.80E+06 | 0.68 | 213.411 | 120.5 |
| 2.00E+06 | 0.75 | 215.169 | 120.5 |
| 2.20E+06 | 0.82 | 216.784 | 120.5 |
| 2.40E+06 | 0.87 | 218.154 | 120.5 |
| 2.60E+06 | 0.91 | 219.267 | 120.5 |
| 2.80E+06 | 0.94 | 219.895 | 120.5 |
| 3.00E+06 | 0.97 | 220.558 | 120.5 |
| 3.20E+06 | 0.99 | 221.242 | 120.5 |
| 3.40E+06 | 1 | 221.4 | 120.5 |
| 3.60E+06 | 1.01 | 221.665 | 120.5 |
| 3.80E+06 | 1 | 221.358 | 120.5 |
| 4.00E+06 | 0.99 | 221.077 | 120.5 |
| 6.00E+06 | 0.68 | 213.453 | 120.5 |
| 8.00E+06 | 0.09 | 199.386 | 120.5 |
| 1.00E+07 | -0.61 | 184.02 | 120.5 |
| 1.20E+07 | -1.39 | 168.198 | 120.5 |
| 1.40E+07 | -2.18 | 153.487 | 120.5 |
| 1.50E+07 | -2.59 | 146.516 | 120.5 |
| 1.52E+07 | -2.67 | 145.098 | 120.5 |
| 1.54E+07 | -2.74 | 143.955 | 120.5 |
| 1.56E+07 | -2.82 | 142.578 | 120.5 |
| 1.58E+07 | -2.91 | 141.216 | 120.5 |
| 1.59E+07 | -2.95 | 140.577 | 120.5 |
| 1.60E+07 | -2.98 | 140.039 | 120.5 |
| 1.61E+07 | -3.02 | 139.329 | 120.5 |

METHOD FOR MEASURING PHASE LOCKED LOOP BANDWIDTH PARAMETERS FOR HIGH-SPEED SERIAL LINKS

BACKGROUND

Modern high-speed serial transceivers have received wide application in cross-chip and serial data communication networks. For example, high-speed serial transceivers are used in applications such as advanced memory buffer (AMB) technology. In contrast to their parallel counterparts, high-speed serial transceivers have the capability of extracting a clock signal encoded within a received data stream, allowing for network synchronization over a single data channel. This capability has consequently eliminated the requirement of sending data and synchronization clock signals over multiple channels. Phase locked loops (PLLs) are utilized in data communications and telecommunications applications to lock onto a frequency and phase of a signal.

The transceiver utilizes the PLL for both a transmitter side and a receiver side of the transceiver. In the transmitter side, the PLL is used to serialize the parallel data and clock it out on the media. In the receiver side, the PLL is used to recover the data and de-serialize the input data. For many cases, a common reference clock is used. Unfortunately, unavoidable routing delays result when distributing the reference clock to both ends of the serial link. Certain bandwidth parameters of the PLL, such as the −3 dB jitter attenuation (also sometimes referred to herein as "−3 dB bandwidth") and the jitter peaking, can be critical for inter-operation considerations.

The bandwidth parameters of both the transmitter PLL and the receiver PLL should be within a given range to avoid excessive jitter, which can be detrimental to optimal or even satisfactory operation of the transceiver. Having clear knowledge of the phase locked loop performance is imperative for the successful application of advanced memory buffer products, as well as other products that utilize high-speed serial links.

SUMMARY

The present invention is directed toward a method for measuring a phase locked loop bandwidth parameter for a high-speed serial link. In one embodiment, the method includes the steps of initiating a jitter frequency of a clock input of a phase locked loop equal to a reference frequency with a sine wave generator; determining a reference jitter amplitude value of a clock output of the phase locked loop with a waveform analyzer at the reference frequency, the reference jitter amplitude value being a function of a time interval error jitter trend of the clock output at the reference frequency; and adjusting the jitter frequency of the clock input with the sine wave generator until an adjusted jitter amplitude value of the clock output reaches a goal value as determined by the waveform analyzer, the adjusted jitter amplitude value being a function of a time interval error trend of the clock output at the adjusted frequency.

In one embodiment, the step of adjusting includes comparing the adjusted jitter amplitude value to the reference jitter amplitude value. Further, in another embodiment, the step of adjusting includes the goal value being approximately a maximum attainable adjusted jitter amplitude value so that a jitter peaking of the phase locked loop can be determined. In one embodiment, the method also includes the step of determining whether a −3 dB bandwidth of the goal value is within a predetermined frequency bandwidth range. Further, the time interval error jitter trend of the clock output can be determined by the waveform analyzer. In one embodiment, the waveform analyzer can be an oscilloscope.

In accordance with certain embodiments, the reference jitter amplitude value and the adjusted jitter amplitude value are each AC (alternating current) root mean square values of the corresponding time interval error jitter trend of the clock output. Further, the step of adjusting can include determining the frequency of the jitter when the ratio of the adjusted jitter amplitude value to the reference jitter amplitude value is approximately 0.707. The step of initiating can include setting the reference frequency of jitter to yield approximately a 0 dB jitter attenuation of the phase locked loop. The method can also include the step of determining whether the adjusted frequency is within a predetermined range of frequencies when the adjusted frequency yields approximately a −3 dB jitter attenuation. In one embodiment, the step of initiating can include the sine wave generator and a clock generator that modulates the clock input of the phase locked loop. The step of adjusting can include increasing the frequency of the sine wave generator. The high-speed serial link can be included in one of an advanced memory buffer, a display port product and a PCI Express switch, as non-exclusive examples.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

A phase locked loop bandwidth measuring system 10 (sometimes referred to herein simply as a "system") having features of the present invention can be used with any suitable devices utilizing high-speed serial links. For example, devices that include advanced memory buffers (AMB's), PCIe switches, display port products, or any other suitable high-speed serial link devices can benefit from the technology disclosed and described herein. It is recognized that the foregoing listing of certain high-speed serial link devices is not intended as an all-inclusive list, and as such, no limitations to these specific devices are intended.

Figure 1:
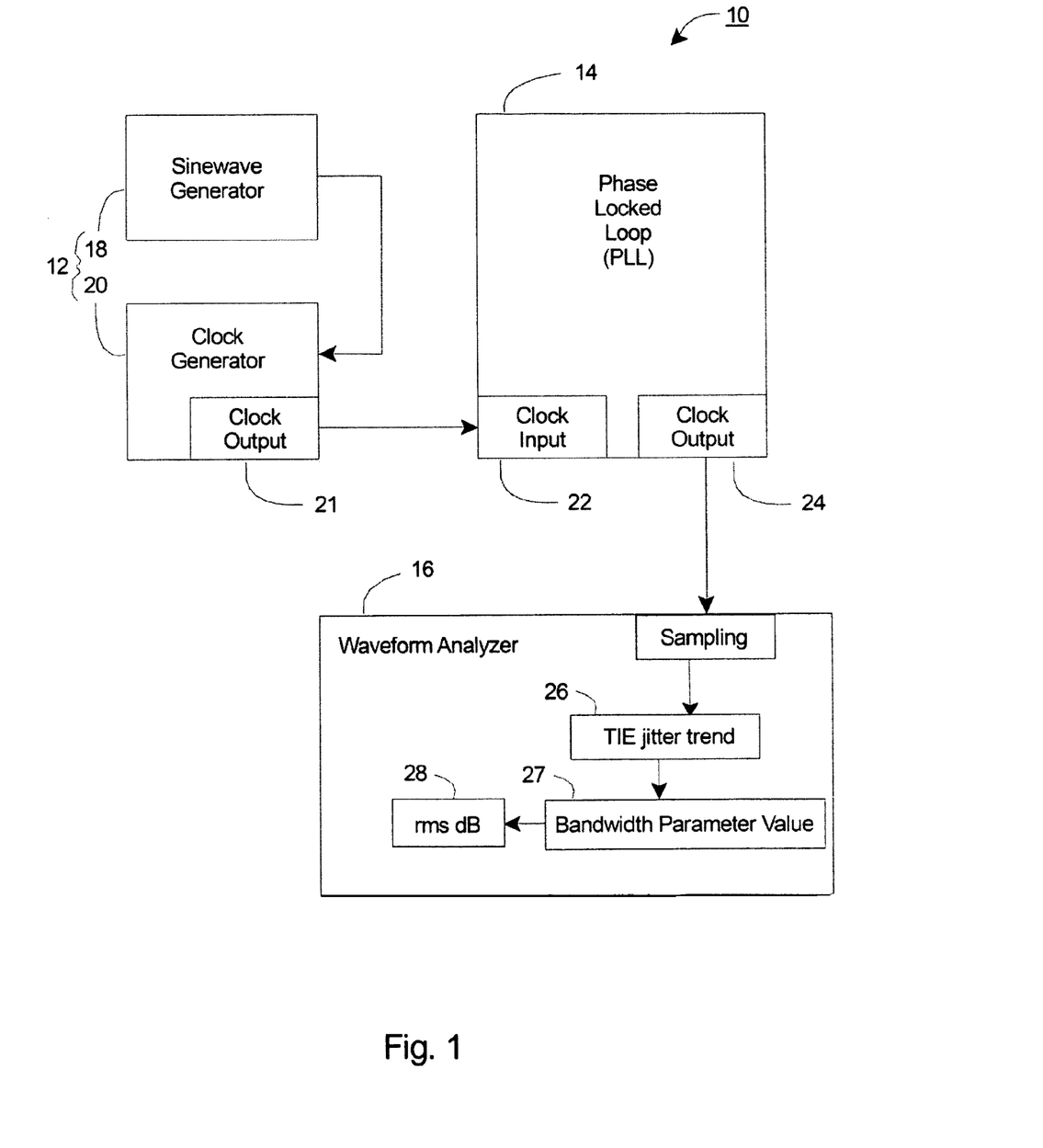
FIG. 1 is a schematic diagram illustrating one embodiment of a phase locked loop bandwidth measuring system having features of the present invention.

FIG. 1 is a schematic diagram illustrating one embodiment of the phase locked loop bandwidth measuring system 10 having features of the present invention. In certain embodiments, the system 10 determines whether a −3 dB bandwidth and/or a jitter peaking of the phase locked loop is within a predetermined acceptable range for a particular high-speed serial link device. The system 10 and the methods utilized by the system 10 can vary depending upon the design requirements of the system 10 and the particular type of high-speed serial link being monitored and/or measured. In the embodiment illustrated in FIG. 1, the system 10 includes a phase modulation clock generator 12, one or more phase locked loops 14 ("PLL"), and a waveform analyzer 16.

In one non-exclusive embodiment, the frequency generator 12 includes a sine wave generator 18 and a clock generator 20. The sine wave generator 18 generates a sine wave at one or more designated frequencies. The clock generator 20 includes a clock output 21 that generates a square wave which is phase modulated by the sine wave generated by the sine wave generator 18, and the output is connected to the clock input 22 of the PLL 14. As described in greater detail below, during the PLL bandwidth measuring process, the frequency sine wave generator 12 can sweep the modulation frequency for an entire frequency range under consideration. As provided in greater detail below, the sweep of the frequency range under consideration can occur at evenly-spaced or linear frequency increments or intervals, or at non-linear increments, such as exponential, logarithmic and/or random increments.

In certain embodiments, the frequency generator 12 initiates an initial jitter frequency (also referred to herein as a "reference frequency") of the clock input 22. In one embodiment, the reference frequency generated by the frequency generator 12 can be a frequency that is substantially lower than a frequency that is anticipated to yield a −3 dB jitter attenuation by the PLL 14. For instance, in one embodiment, the reference frequency can be approximately ¹⁄₁₀₀ or less of the anticipated −3 dB jitter attenuation. In one such embodiment, for high-speed serial links used in advanced memory buffers, the reference frequency can be approximately 100 KHz. However, in non-exclusive alternative embodiments, the reference frequency can be less than approximately 10 KHz, 50 KHz, 200 KHz, 500 KHz or 1 MHz. The frequency generator 12 can then adjust the jitter frequency (typically increasing the frequency from the reference frequency) of the clock input 22 of the PLL 14, as described herein.

The PLL 14 includes the clock input 22 and a clock output 24. The waveform analyzer 16 receives, samples and/or monitors the clock output 24 of the PLL 14. In one embodiment, the waveform analyzer 16 can include an oscilloscope. Alternatively, the waveform analyzer 16 can include any other suitable device that can measure and/or analyze the clock output 24 of the PLL 14. In one embodiment, the waveform analyzer 16 can measure, determine and/or derive an average (e.g., a root mean square or "rms") time interval error jitter trend value 26 ("TIE jitter trend value") of the clock output 24 of the PLL 14 at various frequencies. The TIE jitter trend value 26 can also be converted by the waveform analyzer 16 to a bandwidth parameter value 27 which is a function of the TIE jitter trend value 26 at each frequency. For example, in one embodiment, the bandwidth parameter value 27 can be an alternating current rms value (also referred to herein as "$AC_{rms}$"). Each jitter frequency as generated by the frequency generator 12 yields a specific jitter amplitude.

Additionally, based on the bandwidth parameter values 27 relative to one another at different jitter frequencies, a jitter amplitude 28 (indicated as rms dB in FIG. 1) can be determined. In one embodiment, the dB frequency bandwidth 28 can be determined by the waveform analyzer 16. Alternatively, the jitter amplitude 28 can be determined by another suitable device, a lookup table, or calculation performed by the user, as non-exclusive examples. In one embodiment, the dB frequency bandwidth 28 is set at 0 dB at the reference frequency. In other words, the reference jitter frequency of the clock input 22 of the PLL 14 generates a jitter amplitude value of clock output 24 that is analyzed by the waveform analyzer 16. In this embodiment, the reference jitter amplitude value is assigned a 0 dB jitter attenuation. Thereafter, the jitter frequency is adjusted one or more times to yield one or more adjusted jitter amplitude values that can be analyzed relative to one another and/or relative to the reference jitter amplitude value in order to determine a −3 dB frequency bandwidth of the PLL 14 and/or a jitter peaking, as set forth in greater detail below.

Figure 2:
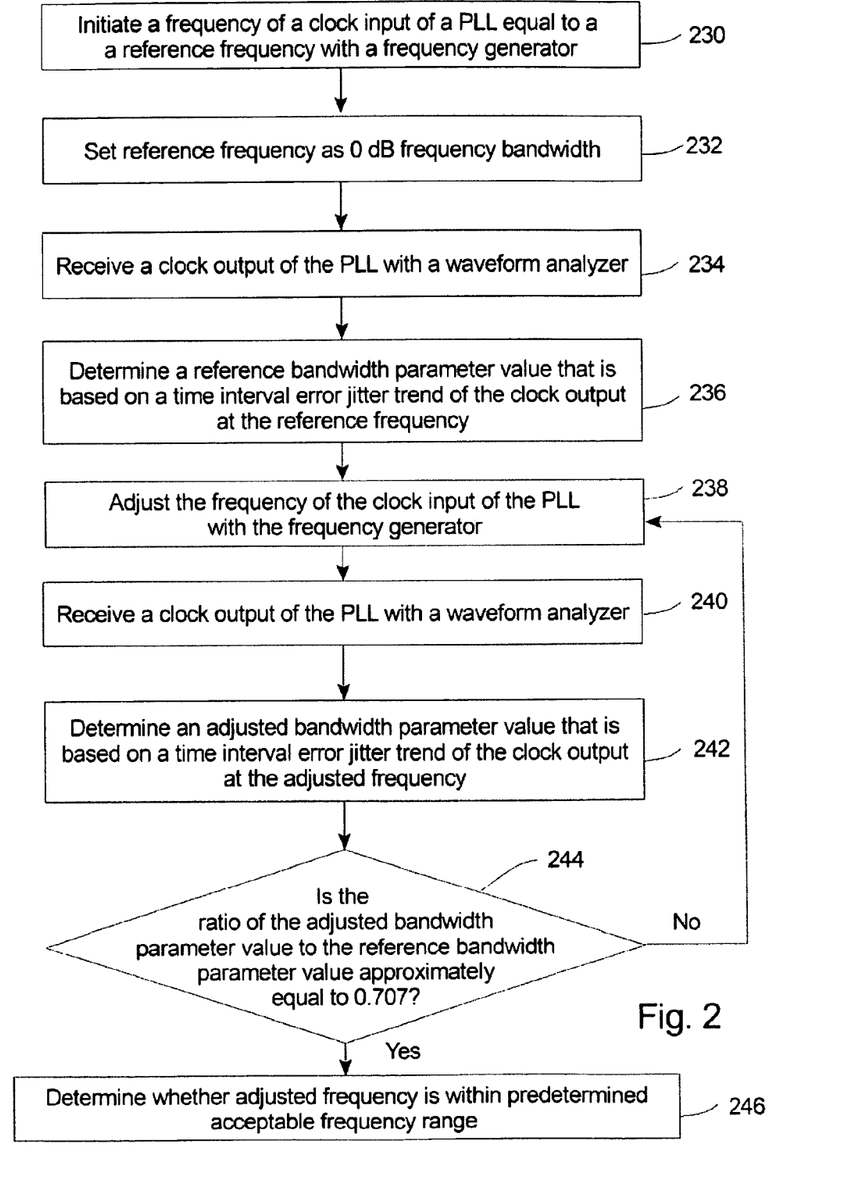
FIG. 2 is a flow chart illustrating one embodiment of a method for measuring PLL bandwidth for a high-speed serial link.

FIG. 2 is a flow chart illustrating one embodiment of a method for measuring a first phase locked loop bandwidth parameter for a high-speed serial link.

At step 230, the method includes initiating a jitter frequency of a clock input of a PLL that is equal to a reference frequency. In one embodiment, a frequency generator is used to initiate the frequency. Alternatively, another suitable means of initiating the frequency can be utilized. In certain embodiments, the reference frequency can be a frequency that is substantially less than the predetermined acceptable frequency range for the −3 dB frequency bandwidth of the given high-speed serial link and/or the device in which the high-speed serial link is used, as written in the specifications for such as link or device. In one embodiment, the reference frequency is a frequency that less than is approximately ¹⁄₁₀₀ of a low end of the predetermined acceptable frequency range. For example, if the specifications call for a −3 dB frequency bandwidth range of 11-33 MHz, the reference frequency can be set at approximately 100 KHz. The specific reference frequency can vary. In non-exclusive alternative embodiments, the reference frequency can be greater than or less than ¹⁄₁₀₀ of a low end of the predetermined acceptable frequency range so long as the PLL jitter attenuation of the frequency is 0 dB.

At step 232, the reference frequency is set as a 0 dB jitter attenuation.

At step 234, a waveform analyzer receives and samples a clock output of the PLL.

At step 236, the method includes determining a reference jitter amplitude value that is based on a time interval error jitter trend (TIE jitter trend) of the clock output at the reference jitter frequency.

At step 238, the jitter frequency of the clock input of the PLL is adjusted using the frequency generator. Typically, the frequency is increased during this step. Each adjustment can be in even increments, or alternatively, each adjustment can be in varying increments.

At step 240, the clock output of the PLL is received by the waveform analyzer.

At step 242, the method includes determining an adjusted jitter amplitude value that is based on the TIE jitter trend of the clock output at the adjusted jitter frequency.

At step 244, it is determined whether the adjusted jitter amplitude has reached a goal value relative to the reference jitter amplitude value. For example, in one embodiment, the goal value of the adjusted jitter amplitude value is reached when the ratio of the adjusted jitter amplitude value to the reference jitter amplitude value is approximately equal to 0.707. Stated another way, a ratio of approximately 0.707 of the adjusted jitter amplitude value to the reference jitter amplitude value results in a −3 dB jitter attenuation, in accordance with equation [1] below:

$$-3\ dB = 20*\log(Jrms(f_{-3\ dB})/Jrms(f_{ref})) \quad [1]$$

where in one embodiment, $Jrms(f_{ref})$ is the reference jitter amplitude value ($AC_{rms}$ value at the reference frequency), and $Jrms(f_{-3\ dB})$ is the adjusted jitter amplitude value that yields a −3 dB frequency bandwidth ($AC_{rms}$ value at an adjusted frequency that is approximately 0.707 times $AC_{rms}$ at the reference frequency).

If it is determined that the ratio of the adjusted bandwidth parameter value to the reference bandwidth parameter value is not approximately equal to 0.707, steps 238-242 are repeated until the ratio of the adjusted bandwidth parameter value to the reference bandwidth parameter value is approximately equal to 0.707. It is recognized that in various embodiments, the ratio does not need to exactly equal 0.707, but only needs to be as near to 0.707 as is desired by the user to establish that the adjusted frequency that approximately yields the −3 dB bandwidth falls within the acceptable range of frequencies at called out by the specification for the particular high-speed serial link. In one embodiment, the waveform analyzer, a user, or some other suitable method can be used to interpolate between two actual adjusted bandwidth parameter values sampled by the waveform analyzer in order to make this determination.

If the ratio of the adjusted bandwidth parameter value to the reference bandwidth parameter value is approximately equal to 0.707, at step 246, a determination is made whether the adjusted frequency is within a predetermined acceptable frequency range. This predetermined acceptable frequency range can be a function of the particular specifications for the given high-speed serial link and/or the device in which the high-speed serial link is used.

Figure 3:
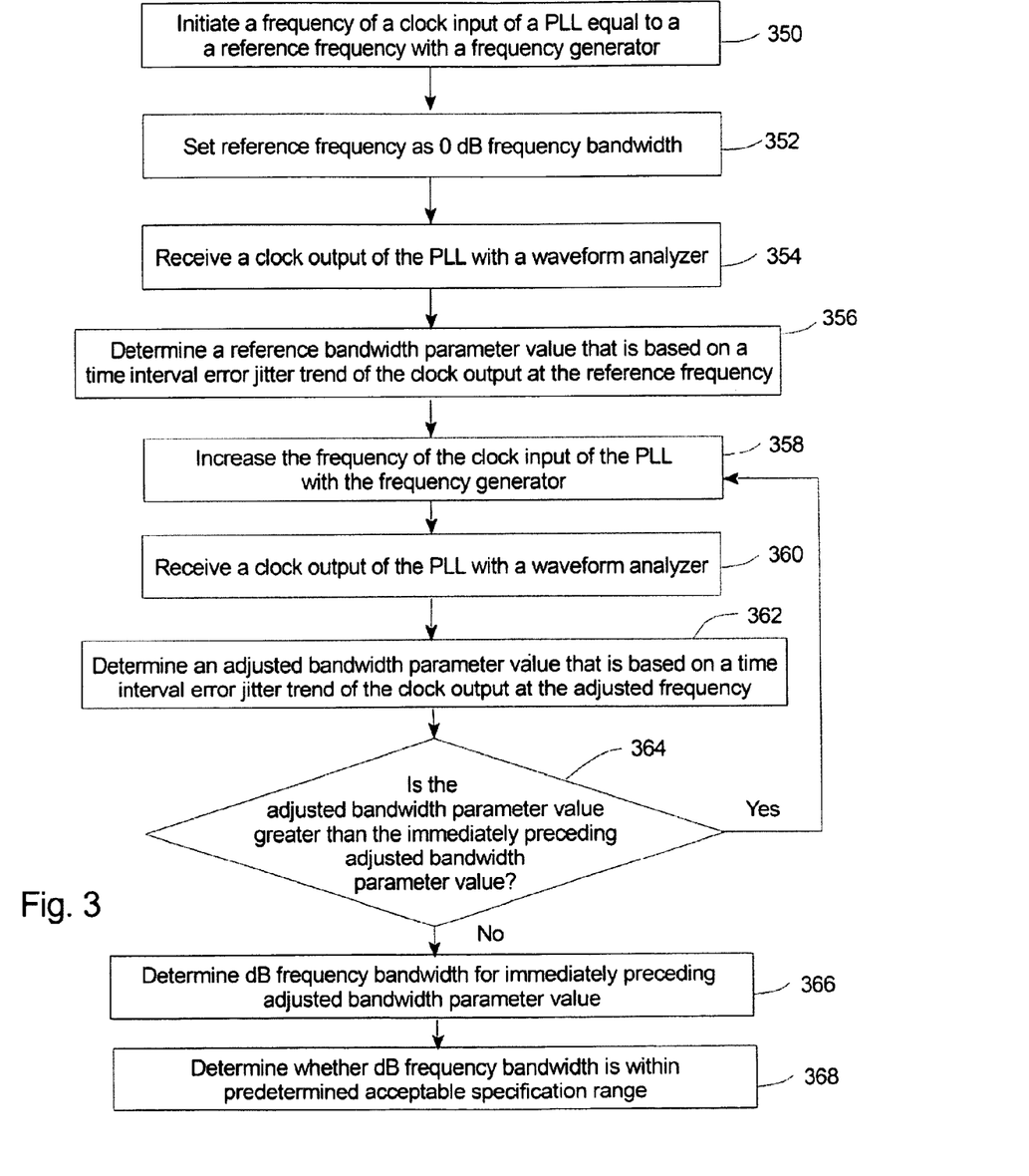
FIG. 3 is a flow chart illustrating another embodiment of a method for measuring PLL jitter peaking for a high-speed serial link.

FIG. 3 is a flow chart illustrating another embodiment of a method for measuring a second phase locked loop bandwidth parameter for a high-speed serial link.

At step 350, the method includes initiating a jitter frequency of a clock input of a PLL that is equal to a reference jitter frequency. In one embodiment, a frequency generator is used to initiate the frequency. Alternatively, another suitable means of initiating the frequency can be utilized. In certain embodiments, the reference frequency can be a frequency that is substantially less than the predetermined acceptable frequency range for the −3 dB frequency bandwidth of the given high-speed serial link and/or the device in which the high-speed serial link is used, as written in the specifications for such as link or device. In one embodiment, the reference frequency is a frequency that less than is approximately 1/100 of a low end of the predetermined acceptable frequency range. For example, if the specifications call for a −3 dB frequency bandwidth range of 11-33 MHz, the reference frequency can be set at approximately 100 KHz. The specific reference frequency can vary. In non-exclusive alternative embodiments, the reference frequency can be greater than or less than 1/100 of a low end of the predetermined acceptable frequency range.

At step 352, the jitter amplitude of reference frequency is set as a 0 dB jitter attenuation.

At step 354, a waveform analyzer receives and samples a clock output of the PLL.

At step 356, the method includes determining a reference jitter amplitude value that is based on a time interval error jitter trend (TIE jitter trend) of the clock output at the reference jitter frequency.

At step 358, the jitter frequency of the clock input of the PLL is adjusted using the frequency generator. Typically, the frequency is increased during this step. Each adjustment can be in even increments, or alternatively, each adjustment can be in varying increments.

At step 360, the clock output of the adjusted frequency of the PLL is received by the waveform analyzer.

At step 362, the method includes determining an adjusted jitter amplitude value that is based on the TIE jitter trend of the clock output at the adjusted jitter frequency.

At step 364, it is determined whether the adjusted jitter amplitude value has reached a goal value. In this embodiment, the goal value is the adjusted maximum jitter amplitude value. Thus, in one embodiment, it is determined whether the adjusted jitter amplitude value is greater than the immediately preceding jitter amplitude value. In the event the adjusted jitter amplitude value is greater than the immediately preceding jitter amplitude value, steps 358-362 are repeated until the adjusted jitter amplitude value is not greater than the immediately preceding jitter amplitude value. Thus, in this embodiment, the goal value is reached immediately prior to a decrease in the adjusted jitter amplitude value from the immediately preceding adjusted jitter amplitude value.

At step 366, in the event the adjusted jitter amplitude value is not greater than the immediately preceding jitter amplitude value, a peak value is determined. This peak value for the immediately preceding jitter amplitude value is also sometimes referred to herein as the jitter peaking of PLL. Stated another way, as a result of the method outlined in FIG. 3, the peak value represents approximately the highest or approximately the peak of the PLL transfer function.

At step 368, a determination is made whether the peak value is within a predetermined acceptable jitter peaking range. This predetermined acceptable jitter peaking range can be a function or part of the particular specifications for the given high-speed serial link and/or the device in which the high-speed serial link is used.

It is recognized that the embodiments provided relative to FIGS. 2-3 are provided as representative examples. Other embodiments can be utilized with the present invention which may omit one or more steps outlined herein, or may add or alter one or more steps that would become obvious to one skilled in the art in view of the present disclosure.

Figure 4:
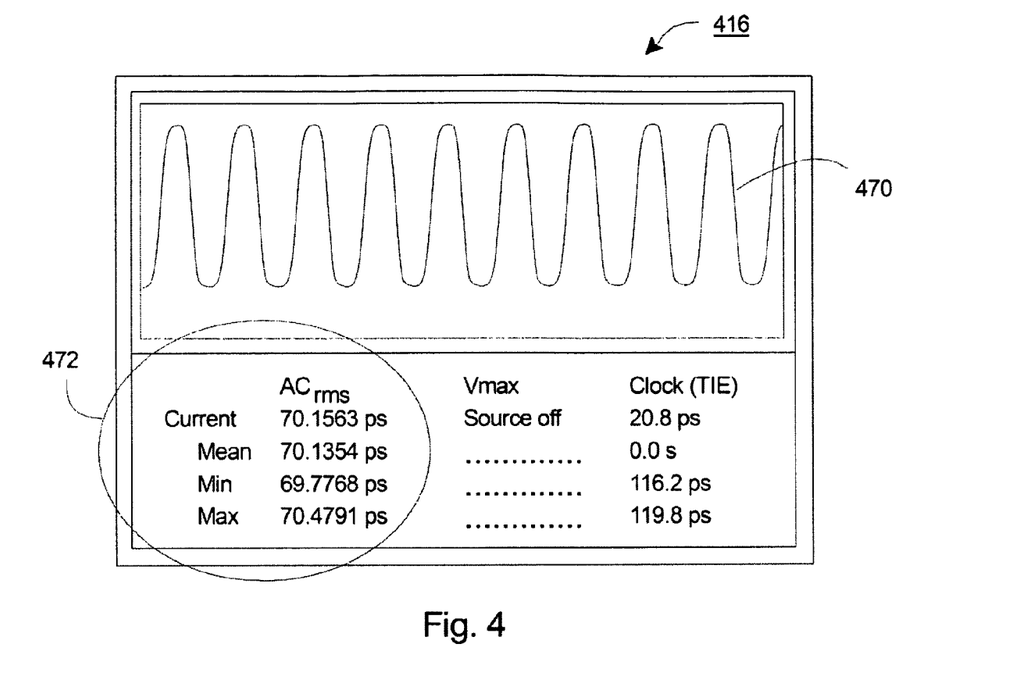
FIG. 4 is a simplified illustration of a waveform analyzer that determines a plurality of bandwidth parameter values of a clock output of a phase locked loop.

FIG. 4 is a simplified illustration of a waveform analyzer that determines a plurality of bandwidth parameter values of a clock output of a phase locked loop. In this embodiment, the waveform analyzer 416 is an oscilloscope. The oscilloscope can generate a curve of the TIE jitter trend 470 from the clock output of the PLL 14 (illustrated in FIG. 1). From the curve of the TIE jitter trend 470, the $AC_{rms}$ 472 can also be determined. Two or more of the $AC_{rms}$ values are then compared to one another to determine the dB frequency bandwidth at a given frequency of the clock input.

Figure 5A:
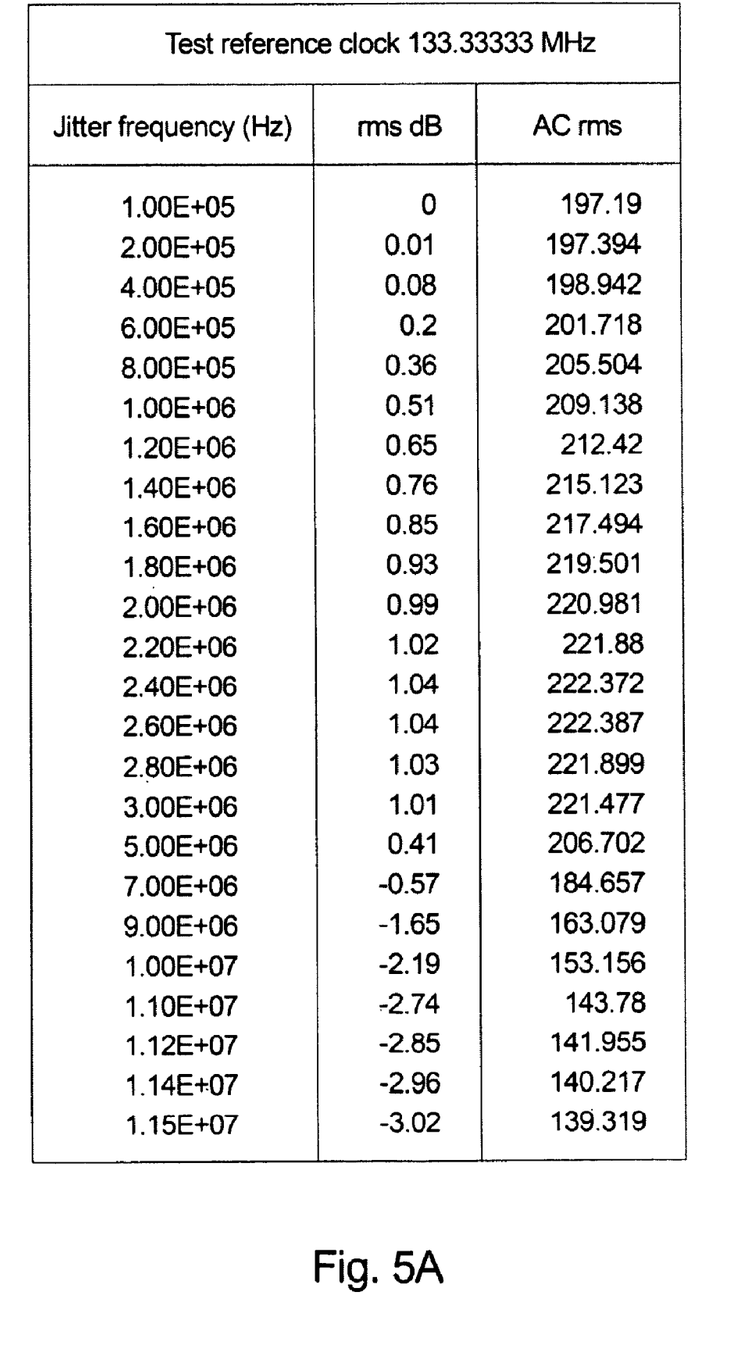
FIG. 5A is an exemplar table of results of a phase locked loop bandwidth parameter (time interval error (TIE) jitter rms) and dB bandwidth as a function of jitter frequency, all at a first operating frequency.
Figure 5B:
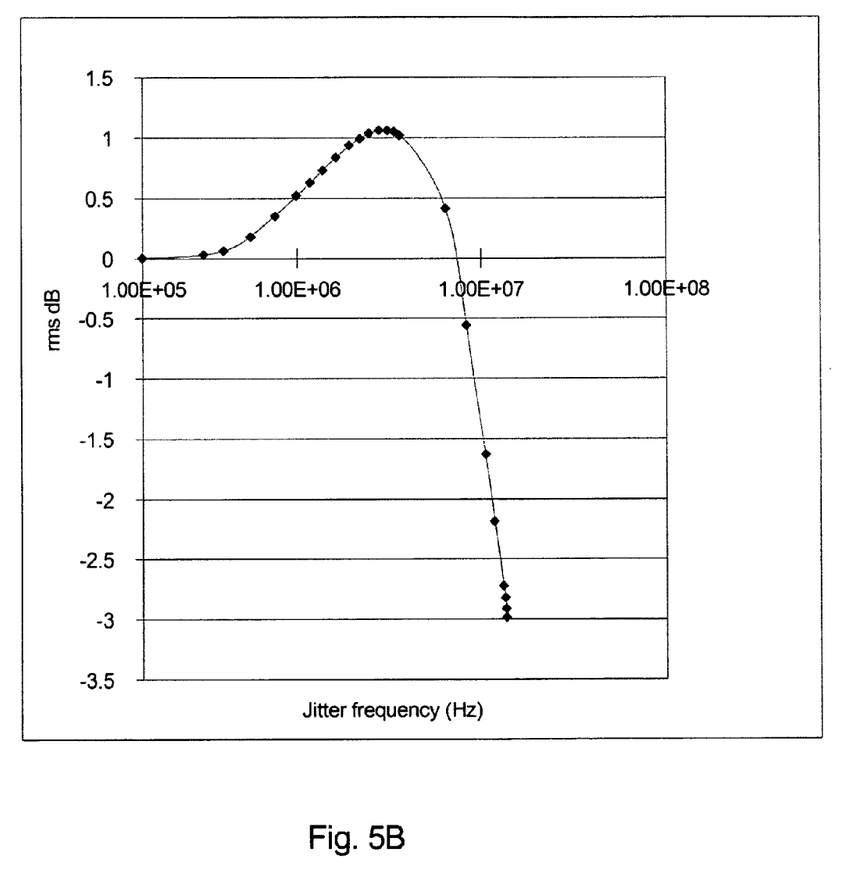
FIG. 5B is a graph illustrating the dB bandwidth as a function of the jitter frequency for the results shown in FIG. 5A.
Figure 6:
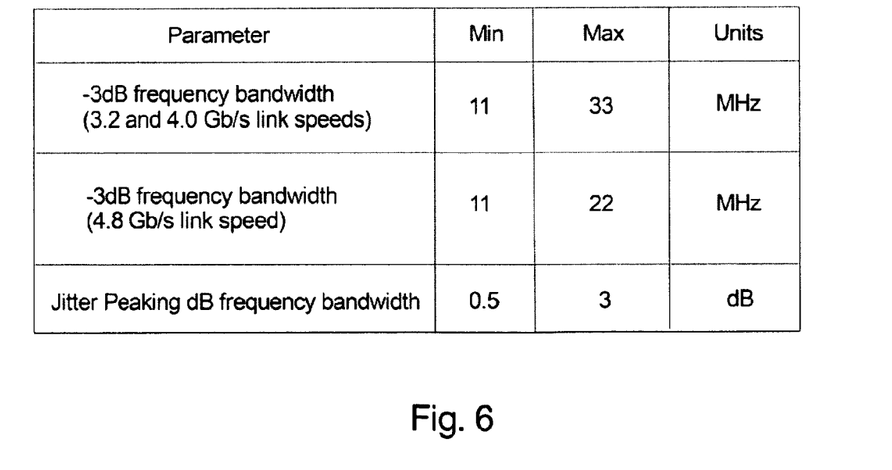
FIG. 6 is an, exemplar table including transmitter and receiver phase locked loop specifications having ranges of acceptable results of a −3 dB bandwidth and a jitter peaking.

FIGS. 5A-5B, 7A-7B and 8A-8B are used in conjunction with FIG. 6 to provide exemplar results for three different operating frequencies (133.33333 MHz, 166.66666 MHz and 200.00000 MHz) for a particular high-speed serial link for an advanced memory buffer.

FIG. 5A is an exemplar table of results of a phase locked loop bandwidth parameter (time interval error (TIE) jitter rms) and dB bandwidth as a function of jitter frequency, all at an operating frequency of 133.33333 MHz. In this example, a reference jitter frequency of 100 KHz is used.

FIG. 6 is an exemplar table including transmitter and receiver phase locked loop specifications having ranges of acceptable results of jitter frequencies for a −3 dB bandwidth and jitter peaking. Referring to FIG. 6, the specifications show an acceptable frequency range at the −3 dB bandwidth of 11 MHz-33 MHz at both 3.2 and 4.0 Gb/s link speeds (133.33333 and 166.66666 MHz operating frequencies, respectively). Thus, the 100 KHz reference frequency used in the example shown in FIG. 5A is less than approximately 1/100 of the lower end of the acceptable range (11 MHz).

In the embodiment in FIG. 5A, the clock output of the PLL is received by the waveform analyzer to determine a reference jitter amplitude value. In this embodiment, the reference jitter amplitude value is equal to the $AC_{rms}$, which in this case equals 197.19 ps. The frequency is then adjusted (increased) to 200 KHz, which yields an adjusted jitter amplitude value of 197.394 ps. To determine the −3 dB frequency bandwidth, the frequency is repeatedly adjusted (increased) until the adjusted jitter amplitude value reaches the goal value. In this embodiment, the goal value is reached when the adjusted jitter amplitude value divided by 197.19 ps approximately equals 0.707. As shown in FIG. 5A, the frequency can be adjusted in even or uneven increments. In this embodiment, once the frequency reaches 11.5 MHz, the adjusted jitter amplitude value is 139.319 ps. Thus, the ratio of the adjusted jitter amplitude value to the reference jitter amplitude value equals approximately 0.707. At this point, a more precise value for the −3 dB frequency bandwidth can be obtained by interpolation methods, if desired. The adjusted frequency of 11.5 MHz is then compared to the specification table in FIG. 6 to determine whether the adjusted frequency falls within the acceptable range for this operating frequency, which in this example, is the case. If the adjusted frequency fell outside the acceptable range, a problem with the high-speed serial link would then have been detected.

In certain embodiments, as the frequency increases, the adjusted bandwidth parameter value initially also increases. Provided the ratio of the adjusted bandwidth parameter value to the reference bandwidth parameter value is greater than 1.00, the jitter peaking will be greater than zero. In one embodiment, the goal value of the adjusted jitter amplitude value is when the adjusted jitter amplitude value has reached its peak. In one embodiment, the jitter peaking initially increases from zero towards a peaking dB bandwidth, at which point the adjusted jitter amplitude value has reached the goal value. However, at a particular frequency, the jitter amplitude will start to decrease (after the jitter peaking has been reached). In the embodiment in FIG. 5A, the jitter peaking is attained when the frequency is approximately 2.60 MHz, yielding a jitter peaking of 1.04 (indicated in FIG. 5A as an "rms dB"). This jitter peaking is then compared to the specification table in FIG. 6 to determine whether the jitter peaking is within the acceptable range for this operating frequency.

Thus, in one embodiment, one goal value is reached when the adjusted jitter amplitude value divided by the reference jitter amplitude value approximately equals a specific number, such as 0.707. Alternatively, or in addition, another goal value is reached when the adjusted jitter amplitude value has reached its peak. Other suitable goal values that are functions of the adjusted jitter amplitude value and/or the reference jitter amplitude value can be monitored and/or compared with a known specification as appropriate without straying from the intent of the present invention.

FIG. 5B is a graph illustrating the jitter amplitude as a function of the jitter frequency for the results shown in FIG. 5A. As illustrated in FIG. 5B, the dB jitter attenuation initially increases above zero, reaches a jitter peaking at approximately 1.04 dB, and then decreases to eventually reach −3 dB jitter attenuation at approximately 11.5 MHz.

Figure 7A:
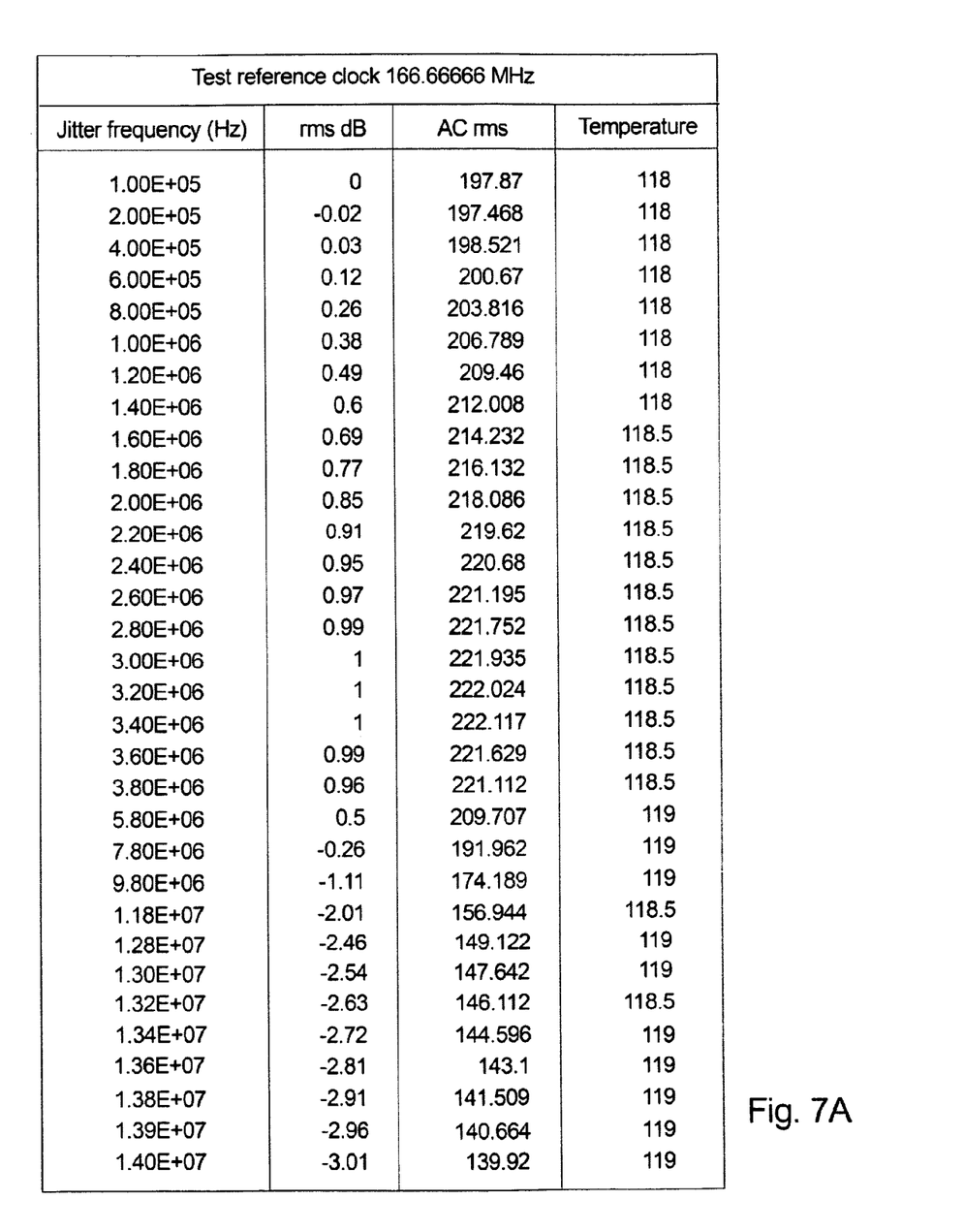
FIG. 7A is an exemplar table of results of the phase locked loop bandwidth parameter sitter rms) and dB bandwidth as a function of jitter frequency, all at a second operating frequency.

FIG. 7A is an exemplar table of results of a phase locked loop jitter amplitude (time interval error (TIE) jitter rms) as a function of jitter frequency, all at an operating frequency of 166.66666 MHz. In this example, a reference frequency of 100 KHz is also used as the clock input of the PLL. In this embodiment, the reference jitter amplitude value is equal to the $AC_{rms}$, which in this case equals 197.87 ps. The frequency is then continually adjusted until the adjusted jitter amplitude value divided by 197.87 ps approximately equals 0.707. As shown in FIG. 7A, the frequency can be adjusted in even or uneven increments. In this embodiment, once the frequency reaches 14.0 MHz, the adjusted jitter amplitude value is 139.92 ps. Thus, the ratio of the adjusted jitter amplitude value to the reference jitter amplitude value equals approximately 0.707. At this point, a more precise value for the −3 dB jitter attenuation can be obtained by interpolation methods, if desired. The adjusted frequency of 14.0 MHz is then compared to the specification table in FIG. 6 to determine whether the adjusted frequency falls within the acceptable range for this operating frequency.

In the embodiment in FIG. 7A, the jitter peaking is attained when the frequency is approximately 3.40 MHz, yielding a jitter peaking of 1 (indicated in FIG. 7A as an "rms dB"). This jitter peaking is then compared to the specification table in FIG. 6 to determine whether the jitter peaking is within the acceptable range for this operating frequency.

Figure 7B:
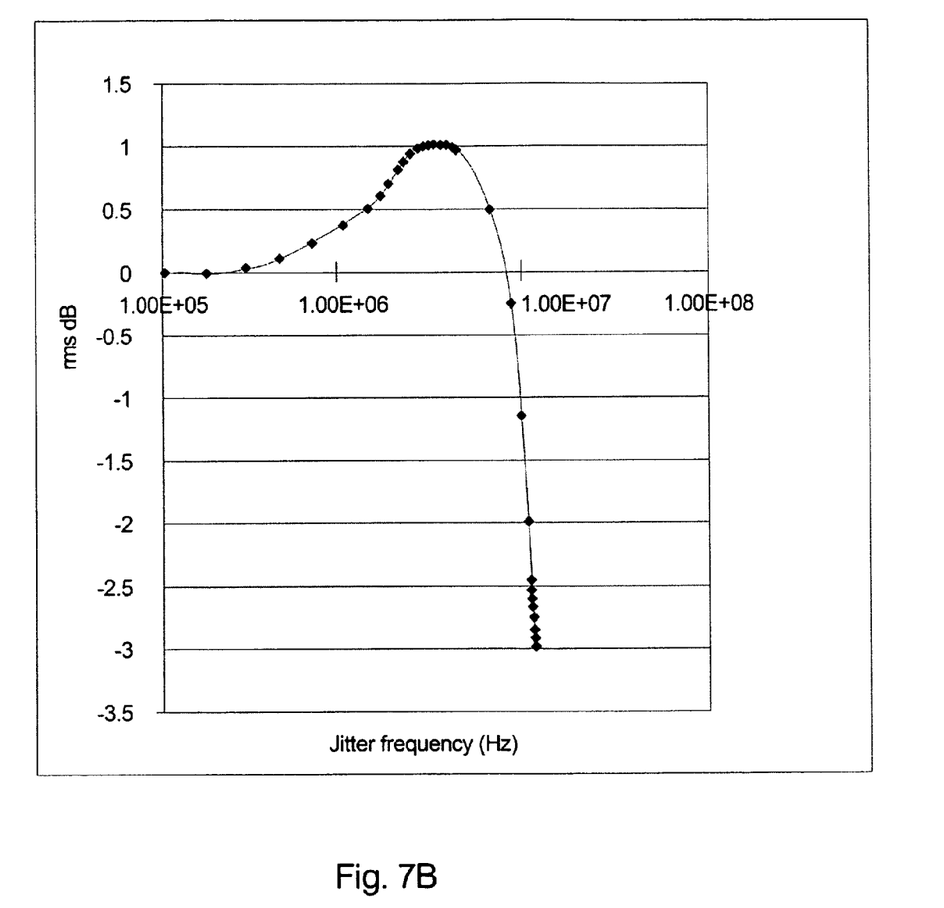
FIG. 7B is a graph illustrating the dB bandwidth as a function of the jitter frequency for the results shown in FIG. 7A.

FIG. 7B is a graph illustrating the jitter amplitude as a function of the jitter frequency for the results shown in FIG. 7A. As illustrated in FIG. 7B, the dB frequency bandwidth initially increases above zero, reaches a jitter peaking at approximately 1 dB, and then decreases to eventually reach −3 dB jitter attenuation at approximately 14.0 MHz.

Figure 8A:
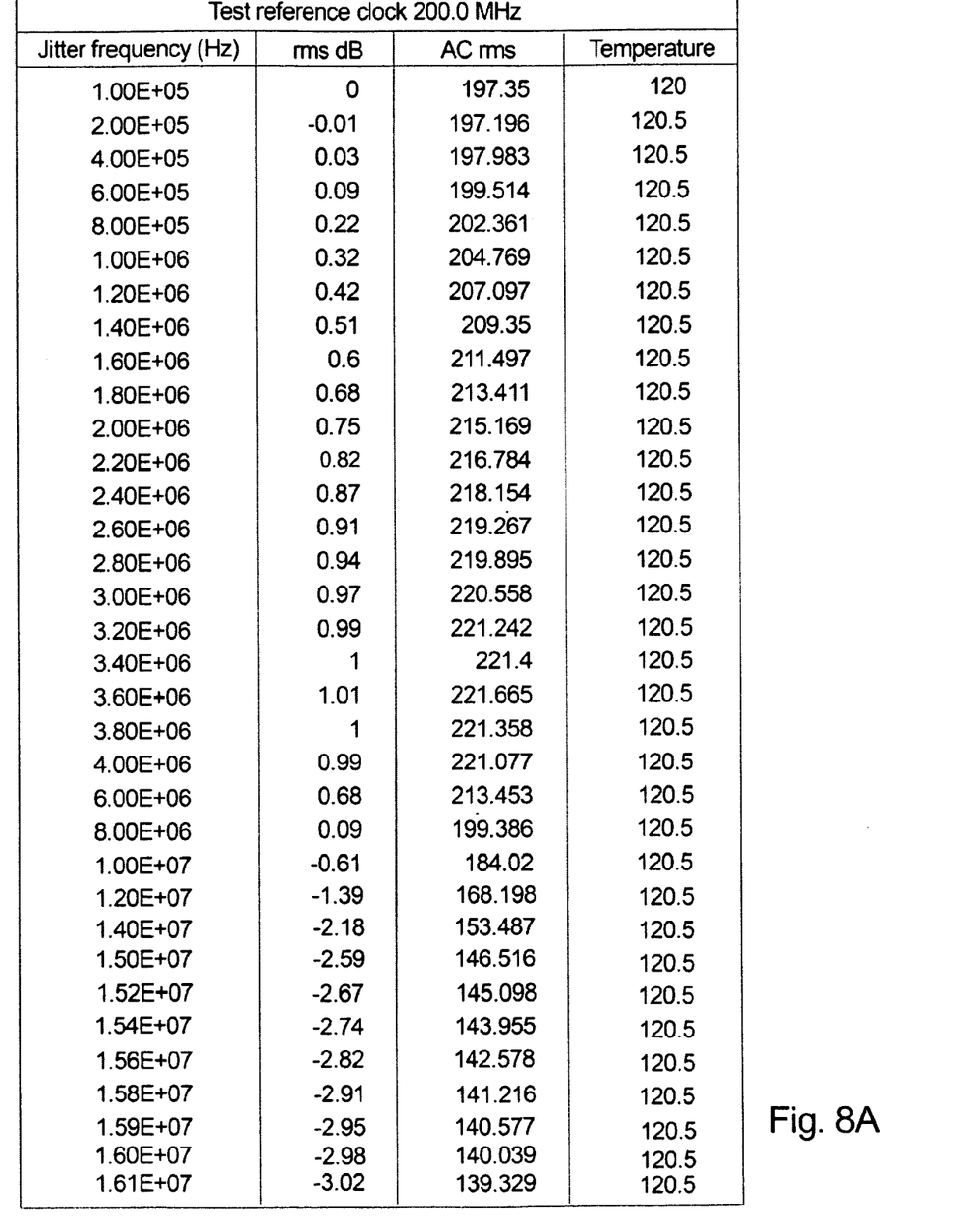
FIG. 8A is an exemplar table of results of the phase locked loop bandwidth parameter (jitter rms) and dB bandwidth as a function of jitter frequency, all at a third operating frequency.

FIG. 8A is an exemplar table of results of a phase locked loop jitter amplitude (time interval error (TIE) jitter rms) and dB bandwidth as a function of jitter frequency, all at an operating frequency of 200.00000 MHz. In this example, a reference frequency of 100 KHz is also used as the clock input of the PLL. In this embodiment, the reference jitter amplitude value is equal to the $AC_{rms}$, which in this case equals 197.35 ps. The frequency is then continually adjusted until the adjusted jitter amplitude value divided by 197.35 ps approximately equals 0.707. As shown in FIG. 8A, the frequency can be adjusted in even or uneven increments. In this embodiment, once the frequency reaches 16.1 MHz, the adjusted jitter amplitude value is 139.329 ps. Thus, the ratio of the adjusted jitter amplitude value to the reference jitter amplitude value equals approximately 0.707. At this point, a more precise value for the −3 dB frequency bandwidth can be obtained by interpolation methods, if desired. The adjusted frequency of 16.1 MHz is then compared to the specification table in FIG. 6 to determine whether the adjusted frequency falls within the acceptable range for this operating frequency.

In the embodiment in FIG. 8A, the jitter peaking is attained when the frequency is approximately 3.60 MHz, yielding a jitter peaking of 1.01 (indicated in FIG. 8A as an "rms dB"). This jitter peaking is then compared to the specification table in FIG. 6 to determine whether the jitter peaking is within the acceptable range for this operating frequency.

Figure 8B:
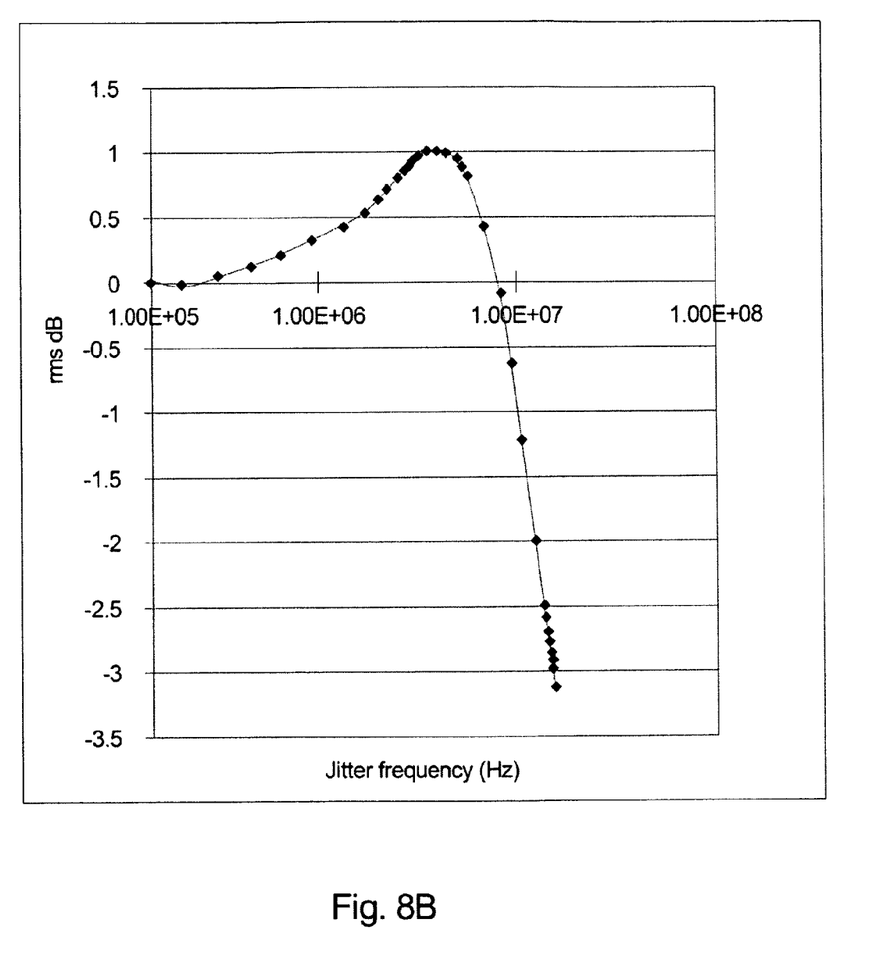
FIG. 8B is a graph illustrating the dB bandwidth as a function of the jitter frequency for the results shown in FIG. 8A.

FIG. 8B is a graph illustrating the jitter amplitude as a function of the jitter frequency for the results shown in FIG. 8A. As illustrated in FIG. 8B, the dB jitter attenuation initially increases above zero, reaches a jitter peaking at approximately 1.01 dB, and then decreases to eventually reach −3 dB jitter attenuation at approximately 16.1 MHz.

While the particular system 10 and methods as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. A method for measuring a phase locked loop bandwidth parameter for a high-speed serial link, the method comprising the steps of:
    initiating a jitter frequency of a clock input of a phase locked loop equal to a reference frequency with a frequency generator;
    determining a reference jitter amplitude value of a clock output of the phase locked loop with a waveform analyzer at the reference frequency, the reference jitter amplitude value being a function of a time interval error jitter trend of the clock output at the reference frequency; and
    adjusting the jitter frequency of the clock input with the frequency generator until an adjusted jitter amplitude value of the clock output reaches a goal value as determined by the waveform analyzer, the adjusted jitter amplitude being a function of a time interval error trend of the clock output at the adjusted frequency.

2. The method of claim 1 wherein the step of adjusting includes comparing the adjusted jitter amplitude value to the reference jitter amplitude value.

3. The method of claim 1 wherein the step of adjusting includes the goal value being approximately a maximum attainable adjusted jitter amplitude value so that a jitter peaking of the phase locked loop can be determined.

4. The method of claim 3 further comprising the step of determining whether a jitter peaking of the goal value is within a predetermined jitter peaking range.

5. The method of claim 1 wherein the time interval error jitter trend of the clock output is determined by the waveform analyzer.

6. The method of claim 5 wherein the waveform analyzer is an oscilloscope.

7. The method of claim 1 wherein the reference jitter amplitude value and the adjusted jitter amplitude value are each alternating current root mean square values of the corresponding time interval error jitter trend of the clock output.

8. The method of claim 7 wherein the step of adjusting includes determining the frequency of the clock input when the ratio of the adjusted jitter amplitude value to the reference bandwidth jitter amplitude is approximately 0.707.

9. The method of claim 1 wherein the step of initiating includes setting the reference jitter frequency to yield approximately a 0 dB jitter attenuation of the phase locked loop.

10. The method of claim 9 further comprising the step of determining whether the adjusted frequency is within a predetermined range of frequencies when the adjusted frequency yields approximately a −3 dB jitter attenuation of the phase locked loop.

11. The method of claim 1 wherein the frequency generator includes a sine wave generator and a clock generator that modulate the clock input of the phase locked loop.

12. The method of claim 1 wherein the step of adjusting includes increasing the jitter frequency of the clock input with the frequency generator.

13. The method of claim 1 wherein the high-speed serial link is included in one of an advanced memory buffer, a display port product and a Peripheral Component Interconnect (PCI) Express switch.

14. A method for measuring a phase locked loop bandwidth parameter for a high-speed serial link, the method comprising the steps of:
    initiating a frequency of a clock input of a phase locked loop equal to a reference frequency with a frequency generator;
    determining a reference jitter amplitude value of a clock output of the phase locked loop with a waveform analyzer at the reference frequency, the reference jitter amplitude value being a function of a time interval error jitter trend of the clock output at the reference frequency, the time interval error trend being determined by the waveform analyzer; and
    adjusting the frequency of the clock input with the frequency generator until an adjusted jitter amplitude value of the clock output reaches a goal value relative to the reference jitter amplitude value, the adjusted jitter amplitude being a function of a time interval error trend of the clock output at the adjusted frequency, the time interval error trend being determined by the waveform analyzer.

15. The method of claim 14 wherein the waveform analyzer is an oscilloscope.

16. The method of claim 14 wherein the reference jitter amplitude value and the adjusted jitter amplitude value are each alternating current root mean square values of the corresponding time interval error jitter trend of the clock output.

17. The method of claim 16 wherein the step of adjusting includes determining the frequency of the clock input when the ratio of the adjusted jitter amplitude value to the reference jitter amplitude value is approximately 0.707.

18. The method of claim 14 wherein the step of initiating includes setting the reference frequency to yield approximately a 0 dB jitter attenuation of the phase locked loop.

19. The method of claim 18 further comprising the step of determining whether the adjusted frequency is within a predetermined range of frequencies when the adjusted frequency yields approximately a −3 dB jitter attenuation of the phase locked loop.

20. The method of claim 14 wherein the frequency generator includes a sine wave generator and a clock generator that modulate the clock input of the phase locked loop.

21. The method of claim 14 wherein the step of adjusting includes increasing the frequency of the clock input with the frequency generator.

22. The method of claim 14 wherein the high-speed serial link is included in one of an advanced memory buffer, a display port product and a Peripheral Component Interconnect (PCI) Express switch.

23. A method for measuring a phase locked loop bandwidth parameter for a high-speed serial link, the method comprising the steps of:
    initiating a frequency of a clock input of a phase locked loop equal to a reference frequency with a frequency generator;
    determining a reference jitter amplitude value of a clock output of the phase locked loop with a waveform analyzer at the reference frequency, the reference jitter amplitude value being an alternating current root mean square value that is a function of a time interval error trend of the clock output at the reference frequency, the time interval error trend being determined by the waveform analyzer; and adjusting the frequency of the clock input with the frequency generator until an adjusted jitter amplitude value of the clock output reaches a goal value, the adjusted jitter amplitude being an alternating current root mean square value that is a function of a time interval error trend of the clock output at the adjusted frequency, the time interval error trend being determined by the waveform analyzer.

24. The method of claim 23 wherein the step of adjusting includes comparing the adjusted jitter amplitude value to the reference jitter amplitude value.

25. The method of claim 23 wherein the step of adjusting includes the goal value being approximately a maximum attainable adjusted jitter amplitude value so that a jitter peaking of the phase locked loop can be determined.

26. The method of claim 25 further comprising the step of determining whether the jitter peaking of the goal value is within a predetermined jitter attenuation range.

27. The method of claim 23 wherein the step of adjusting includes determining the frequency of the clock input when the ratio of the adjusted jitter amplitude value to the reference jitter amplitude value is approximately 0.707.

28. The method of claim 23 wherein the step of initiating includes setting the reference frequency to yield approximately a 0 dB jitter attenuation of the phase locked loop, and further comprising the step of determining whether the adjusted frequency is within a predetermined range of frequencies when the adjusted frequency yields approximately a −3 dB jitter attenuation of the phase locked loop.

29. The method of claim 23 wherein the frequency generator includes a sine wave generator and a clock generator that modulate the clock input of the phase locked loop.

30. The method of claim 23 wherein the step of adjusting includes increasing the frequency of the clock input with the frequency generator.

31. The method of claim 23 wherein the high-speed serial link is included in one of an advanced memory buffer, a display port product and a Peripheral Component Interconnect (PCI) Express switch.

* * * * *